(12) United States Patent
Sorg et al.

(10) Patent No.: US 7,695,990 B2
(45) Date of Patent: Apr. 13, 2010

(54) FABRICATING SURFACE MOUNTABLE SEMICONDUCTOR COMPONENTS WITH LEADFRAME STRIPS

(75) Inventors: Joerg-Erich Sorg, Regensburg (DE); Gertrud Kraeuter, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 19 days.

(21) Appl. No.: 11/318,034

(22) Filed: Dec. 23, 2005

(65) Prior Publication Data

US 2006/0099741 A1    May 11, 2006

Related U.S. Application Data

(62) Division of application No. 10/635,937, filed on Aug. 5, 2003, now Pat. No. 6,995,029.

(60) Provisional application No. 60/401,273, filed on Aug. 5, 2002.

(30) Foreign Application Priority Data

Feb. 17, 2003    (DE) ................... 10306557

(51) Int. Cl.
    *H01L 21/00* (2006.01)
(52) U.S. Cl. .......... 438/26; 436/110; 436/123; 257/88; 257/100; 257/432; 257/E23.061; 257/E21.499; 29/825; 29/855
(58) Field of Classification Search ............. 438/26, 438/110, 111, 112, 113, 123, 124, 127, 611; 257/80, 88, 100, 432, 433, 672, 784, E23.061, 257/E21.499; 29/825, 855
See application file for complete search history.

(56) References Cited

U.S. PATENT DOCUMENTS

| | | | |
|---|---|---|---|
| 4,843,280 A | 6/1989 | Lumbard et al. | |
| 5,156,716 A | 10/1992 | Parthasarathi | |
| 5,748,658 A * | 5/1998 | Nakanishi et al. | 372/43.01 |
| 5,814,837 A * | 9/1998 | Okazaki | 257/91 |
| 5,907,151 A * | 5/1999 | Gramann et al. | 250/214.1 |
| 5,976,912 A | 11/1999 | Fukutomi et al. | |
| 6,060,782 A * | 5/2000 | Ohsono et al. | 257/738 |
| 6,088,901 A * | 7/2000 | Huber et al. | 29/469.5 |
| 6,095,423 A * | 8/2000 | Houdeau et al. | 235/487 |
| 6,184,544 B1 * | 2/2001 | Toda et al. | 257/98 |

(Continued)

FOREIGN PATENT DOCUMENTS

DE    196 40 304    10/2000

(Continued)

OTHER PUBLICATIONS

Fairchild Semiconductor: "Surface Mount LED Lamp, Super Bright 0402", Fairchild Semiconductor Corporation, Aug. 31, 2001, pp. 1-6.

(Continued)

*Primary Examiner*—W. David Coleman
*Assistant Examiner*—Su C Kim
(74) *Attorney, Agent, or Firm*—Fish & Richardson P.C.

(57) ABSTRACT

The invention relates to a method for producing an electrical leadframe (10), in particular for a light-emitting diode component, having at least one first electrical connection conductor (2) and at least one second electrical connection conductor (3).

23 Claims, 6 Drawing Sheets

U.S. PATENT DOCUMENTS

| | | |
|---|---|---|
| 6,288,904 B1 | 9/2001 | Houdeau et al. |
| 6,486,543 B1 | 11/2002 | Sano et al. |
| 6,562,250 B1 * | 5/2003 | Kaneda et al. ............... 216/13 |
| 6,586,323 B1 | 7/2003 | Fan et al. |
| 6,624,491 B2 * | 9/2003 | Waitl et al. ................. 257/434 |
| 6,634,543 B2 * | 10/2003 | Curcio et al. .......... 228/180.21 |
| 2002/0041016 A1 * | 4/2002 | Hyodo et al. ............... 257/678 |
| 2002/0190262 A1 * | 12/2002 | Nitta et al. .................... 257/99 |
| 2003/0057421 A1 * | 3/2003 | Chen .......................... 257/79 |

FOREIGN PATENT DOCUMENTS

| | | |
|---|---|---|
| DE | 100 08 203 | 8/2001 |
| DE | 100 41 328 | 3/2002 |
| DE | 10228634 A1 | 1/2004 |
| DE | 10234978 A1 | 2/2004 |
| EP | 0415659 A2 | 3/1991 |
| EP | 0816925 A1 | 1/1998 |
| EP | 1056126 A2 | 11/2000 |
| GB | 2178231 A | 2/1987 |
| JP | 04-037042 | 2/1992 |
| JP | 08-298345 | 11/1996 |
| JP | 11-126803 | 5/1999 |
| JP | 2000-049382 | 2/2000 |
| JP | 2001-308385 | 11/2001 |
| JP | 2001-354938 | 12/2001 |
| JP | 2002-026192 | 1/2002 |
| WO | WO 94/11902 | 5/1994 |
| WO | WO 99/04367 | 1/1999 |
| WO | WO 02/17405 | 2/2002 |

OTHER PUBLICATIONS

International Search Report, International Application No. PCT/DE03/02522, Dec. 12, 2003, pp. 1-2.

Translation of the Reasons for Rejection for Japanese Patent Application No. 2004-526605, dispatched Apr. 16, 2009, 8 pages.

* cited by examiner

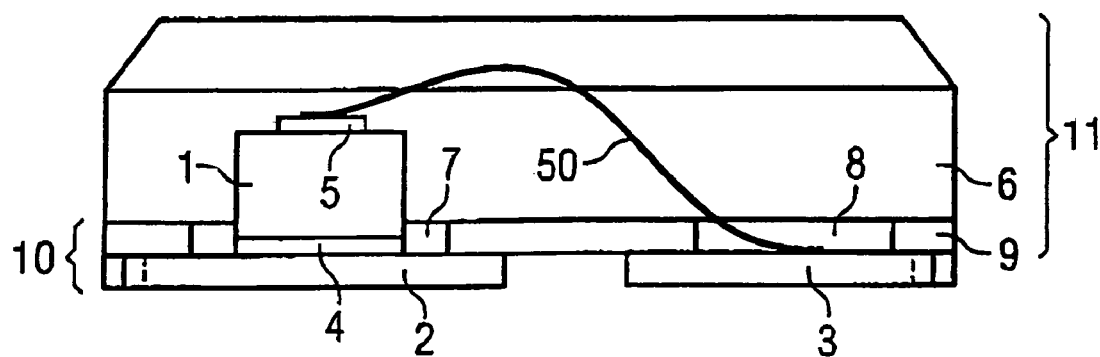
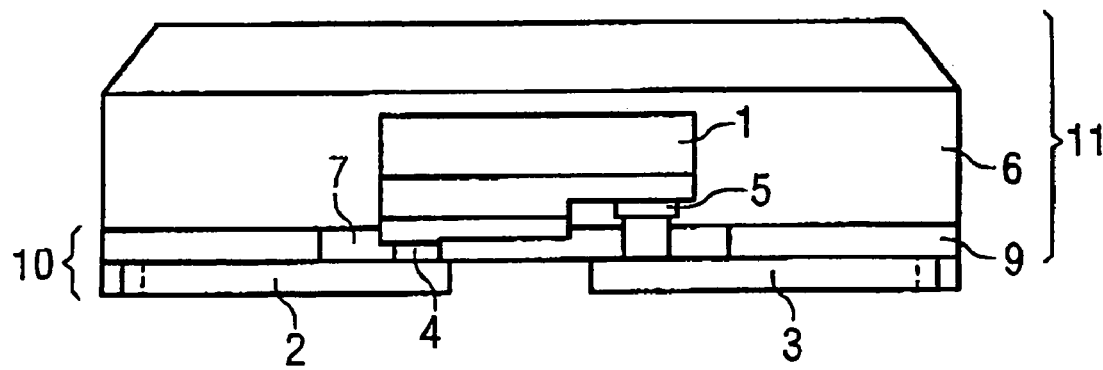

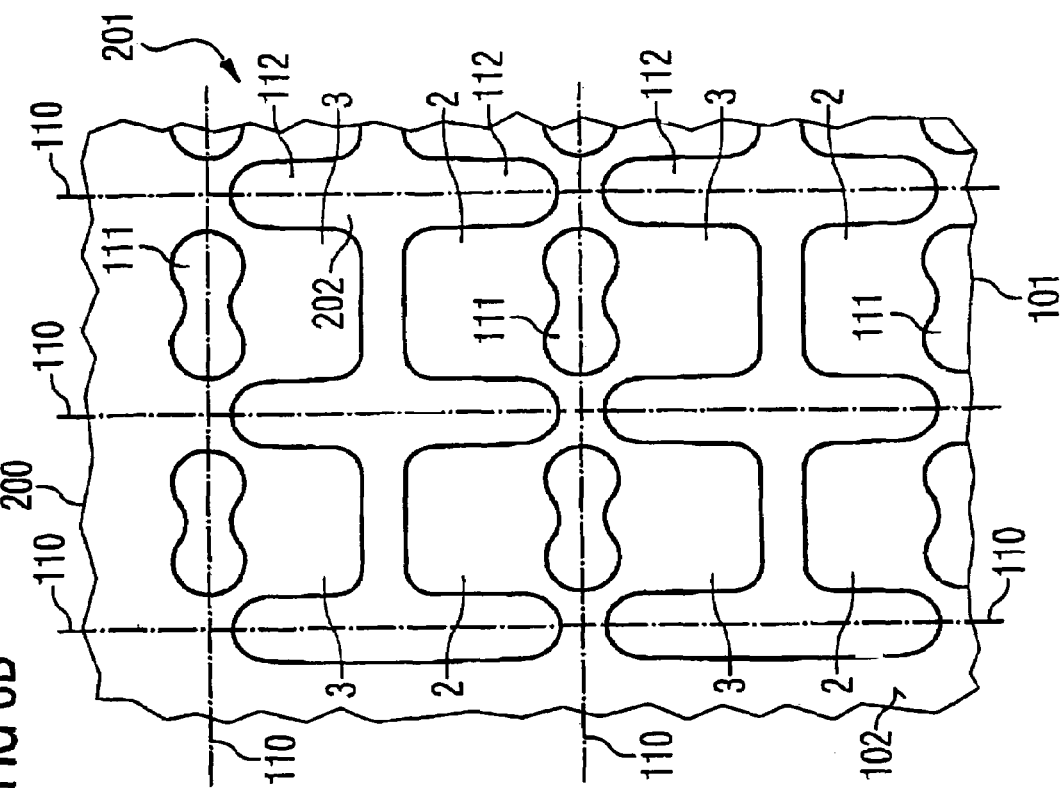
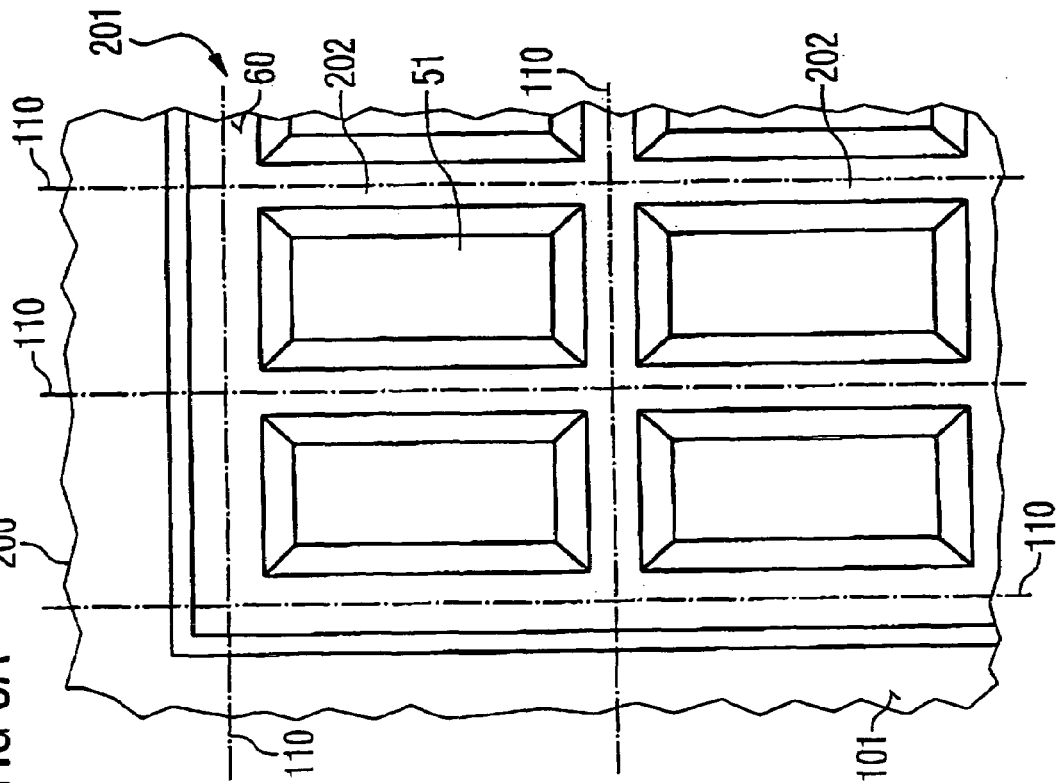

FABRICATING SURFACE MOUNTABLE SEMICONDUCTOR COMPONENTS WITH LEADFRAME STRIPS

CROSS-REFERENCE TO RELATED APPLICATIONS

This application is a divisional and claims the benefit of priority under 35 U.S.C. Section 120 of U.S. application Ser. No. 10/635,937, filed Aug. 5, 2003 now U.S. Pat. No. 6,995,029, which claims the benefit of priority under 35 U.S.C. Section 119(e)(1) to U.S. Provisional Application Ser. No. 60/401,273, filed on Aug. 5, 2002, and which also claims foreign priority under 35 U.S.C. Section 119 to German Application Serial No. 10306557.1-33, filed Feb. 17, 2003. The disclosure of each prior application is considered part of and is incorporated by reference in the disclosure of this application.

TECHNICAL FIELD

The invention relates to a method for producing an electrical leadframe, such as a leadframe for a surface mountable semiconductor component having a semiconductor chip, at least two external electrical connections, which are electrically conductively connected to at least two electrical contacts of the semiconductor chip, and a chip encapsulation. The invention also relates to a leadframe strip and a method for producing a surface-mountable semiconductor component.

BACKGROUND

In order to expand the areas of use and in order to reduce the production costs, attempts are made to produce semiconductor components in ever smaller structural sizes. By way of example, the backlighting of the keys of mobile telephones requires very small light-emitting diodes.

Light-emitting diode housings with an installation area dimensioned as 0402 (corresponding to 0.5 mm×1.0 mm) and a device height of 400 µm-600 µm have become available in the meantime. Such a housing is described in the data sheet from FAIRCHILD SEMICONDUCTOR® concerning the QTLP690C-x design. The corresponding device concept is described in the document U.S. Pat. No. 4,843,280.

A further reduction of the device height is desirable, but is extremely difficult with the conventionally available housing concepts.

SUMMARY

The present invention is based on the object of providing a concept for a surface-mountable semi-conductor component, in particular for surface mountable miniature light-emitting diode and/or photodiode components, which permits the structural size, in particular the structural height, to be reduced more extensively.

In one aspect, the invention is directed to a method for producing an electrical leadframe (10) for a light-emitting diode component, the electrical leadframe having at least one first electrical connection conductor (2) and at least one second electrical connection conductor (3). The method includes producing a layer composite comprising an electrically insulating carrier layer (101) and an electrically conductive connection conductor layer (102), patterning of the carrier layer (101) in such a way that a contact-making window (7) to the connection conductor layer (102) is produced in said carrier layer, and c) patterning of the connection conductor layer (102) in such a way that the first electrical connection conductor (2) and the second electrical connection conductor (3) are produced. At least one of first and second electrical connection conductors can be electrically connected through the contact-making window (7).

In another aspect, the invention is directed to a method for producing a surface-mountable semiconductor component having at least one semiconductor chip (1), at least two external electrical connection conductors (2, 3), which are connected to at least two electrical contacts (4, 5) of the semiconductor chip (1), and having a chip housing (11) having a connection carrier (9) and a chip encapsulation (6). The method includes applying an electrically insulating carrier layer (101) to an electrically conductive connection conductor layer (102), patterning at least one chip window (7) and at least one wire connection window (8) in the carrier layer (101), patterning the external electrical connection conductors (2,3) into the connection conductor layer (102), mounting the semiconductor chip (1) into the chip window (7), electrically connecting at least one electrical contact (5) of the semiconductor chip (1) to a connection conductor (3) by means of a bonding wire (50) through the wire connection window (8), placing the composite comprising patterned connection conductor layer (102), patterned carrier layer (101), semiconductor chip (1) and bonding wire (50) into an injection mold, and encapsulating the semiconductor chip (1) including bonding wire (50) with an encapsulation material (6) by injection molding, which material is subsequently at least partly cured or incipiently cured.

In another aspect, the invention is directed to a method for producing a surface-mountable semiconductor component having at least one semiconductor chip (1), at least two external electrical connection conductors (2, 3), which are connected to at least two electrical contacts (4, 5) of the semiconductor chip (1), and having a chip housing (11) having a connection carrier (9) and a chip encapsulation (6). The method includes applying an electrically insulating carrier layer (101) to an electrically conductive connection conductor layer (102), patterning at least one chip window (7) in the carrier layer (101), patterning the external electrical connection conductors (2, 3) into the connection conductor layer (102) with the two connection conductors (2, 3) partly overlapping the chip window (7), mounting the semiconductor chip onto the external electrical connection conductors (2, 3) in the chip window (7) in such a way that a first contact (4) and a second contact (5) of the semiconductor chip (1) bear on the first (2) and, respectively, on the second of the two connection conductors (3) and are electrically connected thereto, placing the composite comprising patterned connection conductor layer (102), patterned carrier layer (101) and semiconductor chip (1) into an injection mold (500), and encapsulating the semiconductor chip (1) with an encapsulation material (6) by injection molding, which material is subsequently at least partly cured or incipiently cured.

In another aspect, the invention is directed to a leadframe strip (200) having a connection conductor layer (102) and a carrier layer (101), on which an array (201) with a multiplicity of component regions (202) is formed, the connection conductor layer (101) being at least partly removed along separating lines (110) between adjacent component regions (202).

In the case of the method, firstly a laminate having an electrically insulating carrier layer and an electrically conductive connection conductor layer is produced. This laminate may consist solely of these two layers. They may be connected to one another by means of an adhesive layer, for example, and may, moreover, be completely unpatterned. In a subsequent step, in each component section of the laminate, at least one contact-making window toward the connection conductor layer may be produced in the carrier layer and at least one first electrical connection track and at least one second electrical connection track may be formed in the connection conductor layer. At least one of the tracks may be electrically connected through the contact-making window.

This electrical leadframe may be suitable for light-emitting diode components having an extremely small structural height of the component housing in relation to the height of the light-emitting diode chip. This leadframe may enable effective heat dissipation from the light-emitting diode chip if the latter is mounted directly onto a connection track in a contact-making window of the carrier layer by means of a thermally conductive joining agent, such as conductive adhesive or metallic solder.

The patterning of the carrier layer may take place before the patterning of the connection conductor layer. However, this sequence can also be reversed.

The carrier layer may be a plastic layer that can be patterned by means of masking and etching techniques. In particular the carrier layer may be a plastic film, such as a polyimide film. The connection conductor layer is an electrically conductive film that can be patterned by means of masking and etching techniques. In particular the conductor layer may be a metal film. The thicknesses of the carrier layer and of the connection conductor layer may be less than 80 µm, and in particular may be between from and including 30 µm and up to and including 60 µm.

A first contact-making window, for example a chip mounting window, toward the first connection track, and a second contact-making window, for example a wire connection window, toward the second connection track, are formed in the carrier layer.

In one embodiment of the method, the carrier layer initially preferably comprises a soluble plastic layer, at least in the regions to be patterned. This carrier layer is made insoluble, such as by incipient curing or curing, except for the areas of the contact-making windows and, if appropriate, other regions that are subsequently to be removed again. This means that in these regions it is then resistant to the solvent for the plastic layer. The contact-making windows and, if appropriate, other regions to be uncovered are subsequently etched free.

For the patterning of the plastic layer, firstly a mask layer, in particular a photoresist layer, can be applied thereto. The photoresist layer can be patterned or applied in patterned fashion in such a way that the regions of the contact-making windows and other regions that are subsequently to be removed are covered by the mask layer. The plastic layer can be subsequently cured in the uncovered regions which are intended to remain on the connection conductor layer, before the photoresist layer and the underlying plastic layer are then removed from the connection conductor layer at least in the regions of the contact-making windows. The uncured plastic layer can be removed from the connection conductor layer by being dissolved.

In another embodiment of the method, for the patterning of the plastic layer, firstly a photomask is positioned above or on said plastic layer, which photomask shades the regions of the contact making windows. The plastic layer is then incipiently cured or cured in unshaded regions which are intended to remain on the connection conductor layer. For this purpose, the plastic layer can preferably be cured by means of UV radiation. Material containing polyimide monomer may be suitable for this purpose. As an alternative, it is possible to use a plastic layer that can be cured by means of thermal radiation.

The photomask layer is subsequently lifted off and the plastic layer is removed from the connection conductor layer in the regions of the contact-making windows. This can be done once again by means of wet-chemical dissolving. The use of a plasma incineration method is conceivable as an alternative.

The connection conductor layer likewise can be patterned by means of a mask and a wet-chemical etching method. Such patterning methods for metal layers, for example, are known from printed circuit board technology and are suitable, in principle, in the present case. Therefore, they will not be explained in any further detail at this point.

As a potential advantage, the patterning methods that have been outlined can be incorporated in a simple manner into existing production methods for semiconductor components and can even at least partly utilize already existing techniques that are often used in the production of semiconductor components.

In a method for producing a leadframe strip having a multiplicity of component sections, a multiplicity of contact-making windows and a multiplicity of electrical connection tracks assigned to said contact-making windows are produced in a laminate strip, which can comprise a metal film as connection conductor layer and a polyimide film as carrier layer, by means of a method as described above. The contact making windows reach as far as onto the connection tracks. A respective group comprising contact-making window and assigned connection tracks is situated in a component section within an array comprising a multiplicity of component sections arranged next to one another on the laminate strip.

In one embodiment, the connection conductor layer is at least partly removed along separating lines between in each case two adjacent component regions. This measure can facilitate the severing of the laminate strip along the separating lines, which is done by sawing or stamping, by way of example.

The method according to the invention can be suitable for producing surface-mountable semiconductor components having in each case at least one semiconductor chip, at least two external electrical connection conductors, which are connected to at least two electrical contacts of the semiconductor chip, and having a plastic housing which encapsulates the semiconductor chip.

In this case, in a first embodiment, firstly an electrical insulating carrier layer is applied to an electrically conductive connection conductor layer. Afterward, at least one chip window and at least one wire connection window are formed in the carrier layer and at least two external electrical connection conductors are formed in the connection conductor layer. Later the semiconductor chip is mounted into the chip window and at least one electrical contact of the semiconductor chip is electrically connected to a connection conductor by means of a bonding wire through the wire connection window. The composite comprising patterned connection conductor layer, patterned carrier layer, semiconductor chip and bonding wire is then placed into an injection mold, in which the semiconductor chip including bonding wire is then encapsulated with an encapsulation material by injection molding, which material is subsequently at least partly incipiently cured or cured.

In such a method for simultaneously producing a multiplicity of semiconductor components, arrays with in each case a multiplicity of component regions are produced in a laminate strip having a connection conductor layer and a carrier layer, in which arrays each component region has at least one chip window, at least one wire connection window and at least two external electrical connection conductors. A multiplicity of semiconductor chips are mounted into the multiplicity of chip windows. The electrical contacts of the semiconductor chips are then connected to the external electrical connection conductors by means of bonding wires through the wire connection windows. The arrays are subsequently placed into an injection mold individually or in groups one after the other, which injection mold has, for each array, a single cavity which spans all the component regions of the array and forms a void there essentially exclusively on the side of the semiconductor chips. Encapsulation material is then introduced into the cavity by injection molding and is at least partly cured there. The array is subsequently removed from the injection mold and singulated into mutually separate semiconductor components by severing the encapsulation material, the carrier layer and, if still necessary, the connection conductor layer.

In a second embodiment, likewise firstly an electrically insulating carrier layer is applied to an electrically conductive connection conductor layer. Afterward, at least one chip window is formed in the carrier layer and at least two external electrical connection conductors are formed in the connection conductor layer, which connection conductors partly overlap the chip window. This structure is suitable for example for semiconductor chips in which at least two electrical contacts are arranged on the same side. Such a chip is mounted in the chip window with the contacts onto the external electrical connection conductors and electrically connected. This composite comprising patterned connection conductor layer, patterned carrier layer and semiconductor chip is subsequently placed into an injection mold, in which the semiconductor chip is then encapsulated with an encapsulation material by injection molding, which material is subsequently at least partly incipiently cured or cured.

In such a method for simultaneously producing a multiplicity of semiconductor components, arrays with in each case a multiplicity of component regions are produced in a laminate strip having a connection conductor layer and a carrier layer, in which arrays each component region has at least one chip window and at least two external electrical connection conductors. In each case at least one semiconductor chip is mounted into the chip windows as described above. The arrays are encapsulated and singulated in the same way as already described further above.

The method according to the invention is especially suitable for producing light-emitting diode components in which light-emitting diode chips are mounted onto the leadframe.

In a leadframe strip having a connection conductor layer (preferably made of a patterned metal film) and a carrier layer (preferably a patterned plastic film in particular made of polyimide material), on which an array with a multiplicity of component regions is formed, the connection conductor layer is at least partly removed along separating lines between two adjacent component regions. This can facilitate the severing of the leadframe after the encapsulation of the array of semiconductor components.

The contact-making windows enable particularly simple monitoring of the alignment of the chip mounting installation and the wire bonding installation. An impermissibly large misalignment of the chip mounting installation and/or wire mounting installation can be rapidly identified because the semiconductor chips and/or connection wires do not adhere on the film after their mounting if they settle on the edge of the contact-making windows. This is all the more important, the smaller the design, because firstly the reliability of the components is impaired by misalignment of the chip mounting all the more, the smaller the volume of the chip encapsulation, and secondly the quantity of rejects is very high in the event of misalignment that is not immediately identified, on account of the high packing density of the components and the associated large quantity of components per unit length on a leadframe tape.

The details of one or more embodiments of the invention are set forth in the accompanying drawings and the description below. Other features, objects, and advantages of the invention will be apparent from the description and drawings, and from the claims.

DESCRIPTION OF DRAWINGS

FIG. 1 shows a diagrammatic sectional illustration of a first exemplary embodiment for a semiconductor component produced by the method according to the invention;

FIG. 2 shows a diagrammatic sectional illustration of a second exemplary embodiment for a semiconductor component produced by the method according to the invention;

FIGS. 6a and 6b show a partial diagrammatic illustration of a plan view from above of a leadframe strip with encapsulated semiconductor chips and, respectively, a partial diagrammatic illustration of a plan view from below of the leadframe strip;

Like reference symbols in the various drawings indicate like elements.

DETAILED DESCRIPTION

Figure 3A:
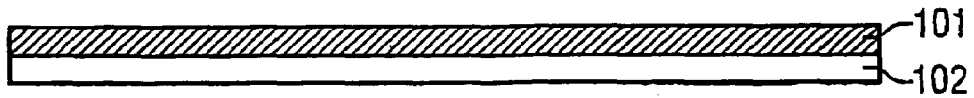
FIGS. 3a to 3f show a diagrammatic illustration of a first exemplary embodiment for a method sequence according to the invention.
Figure 3B:
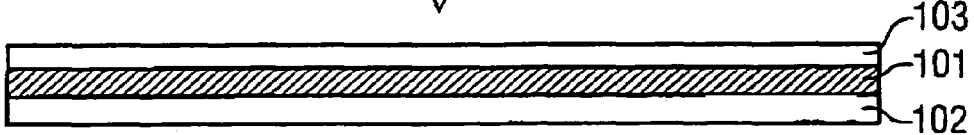

A method for producing a leadframe 10 for a surface mountable semiconductor component in accordance with FIG. 1 or FIG. 2, which is a light-emitting semiconductor component in the exemplary embodiment, quite generally has the following steps: a) production of a layer composite comprising an electrically insulating carrier layer 101 (the carrier layer is preferably a plastic film comprising polyimide or a polyimide-containing material) and an electrically conductive connection conductor layer 102 (examples of suitable materials for this are copper and copper based alloys) (see FIGS. 3a and 4a); b) patterning of the carrier layer 101 by means of masking and etching, in such a way that a first contact-making window 7 and a second contact-making window 8 are formed in it, which windows lead to the later first connection conductor 2 and, respectively, to the second connection conductor 3 (see FIGS. 3b-3d and 4b-4c); and c) patterning of the connection conductor layer 102 by means of masking and etching, in such a way that the first electrical connection conductor 2 and the second electrical connection conductor 3 are produced, which can be electrically connected through the first contact-making window 7 and, respectively, through the second contact-making window 8 (see FIGS. 3e-3f and 4d-4e).

As an alternative, step c) may take place before step b). The thickness of the connection carrier layer 101 lies between from and including 30 μm and up to and including 60 μm. The same applies to the thickness of the connection conductor layer 102.

The carrier layer 101, prior to patterning, at least in the regions to be patterned, is not yet cured and can be removed by means of a suitable solvent. Except for the areas of the contact-making windows 7 and 8 and, if appropriate, other regions that are subsequently to be removed, the carrier layer will be cured. The uncured regions of the carrier layer are subsequently removed.

Figure 3C:
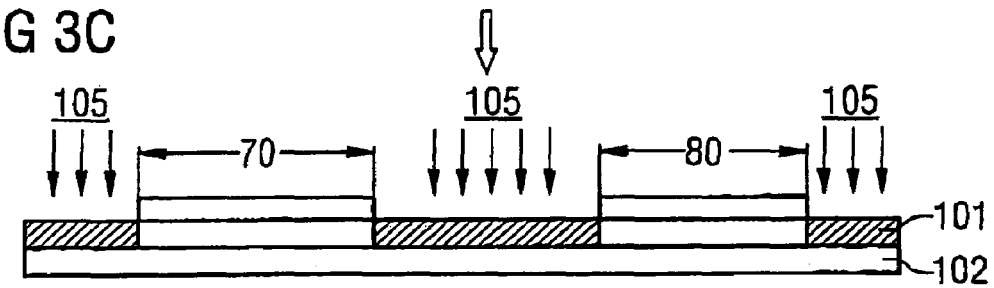
Figure 3D:
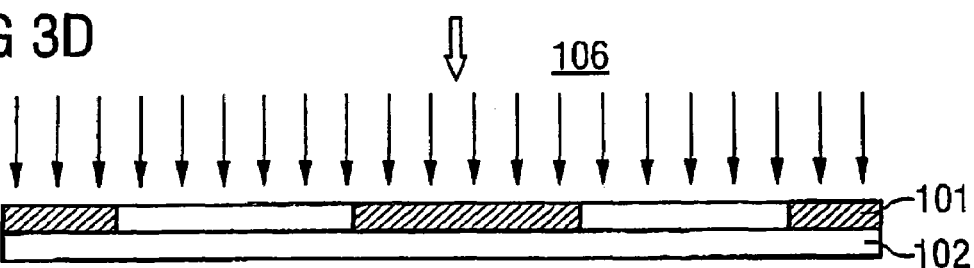
Figure 3E:
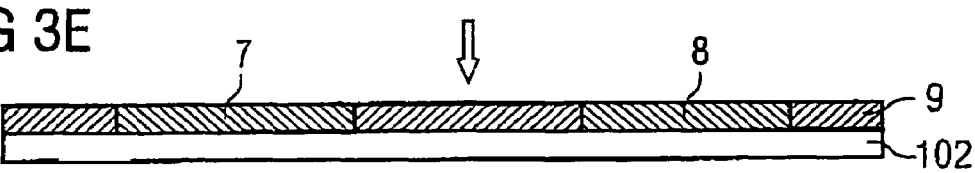
Figure 3F:
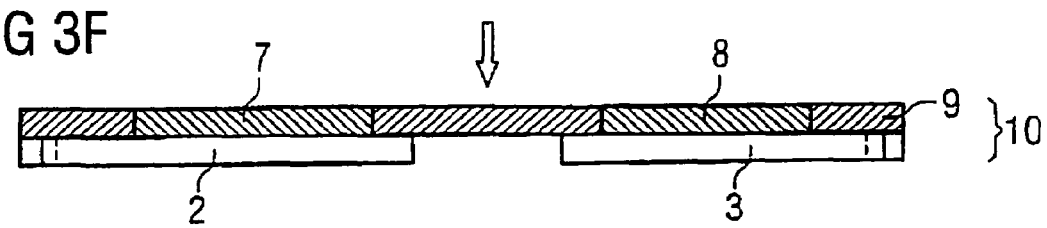
Figure 4A:
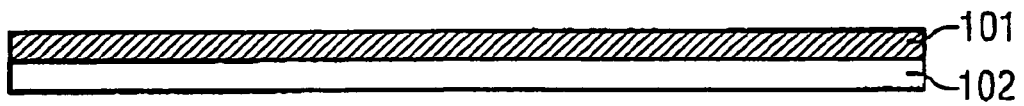
FIGS. 4a to 4e show a diagrammatic illustration of a second exemplary embodiment for a method sequence according to the invention.

For the patterning of the plastic carrier layer 101, firstly a photoresist layer 103 is applied thereto (FIG. 3b), which photoresist layer is patterned by means of known methods in such a way that the regions 70 and 80 of the contact-making windows 7, 8 are covered by the photoresist layer 103 (FIG. 3c). The plastic layer is cured in the uncovered regions, preferably by means of UV radiation 105 (FIG. 3c). The photoresist layer 103 and the underlying plastic layer are subsequently removed from the connection conductor layer 102 in the regions 70 and 80. Examples of suitable solvents for this purpose are IPA (isopropanol) and acetone.

Figure 4B:
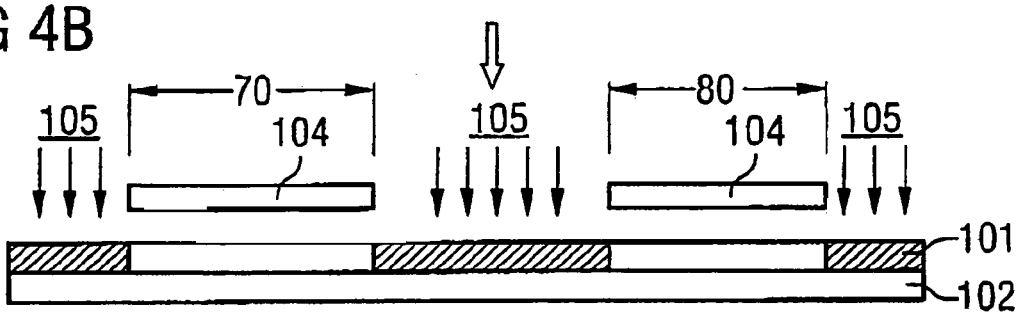
Figure 4C:
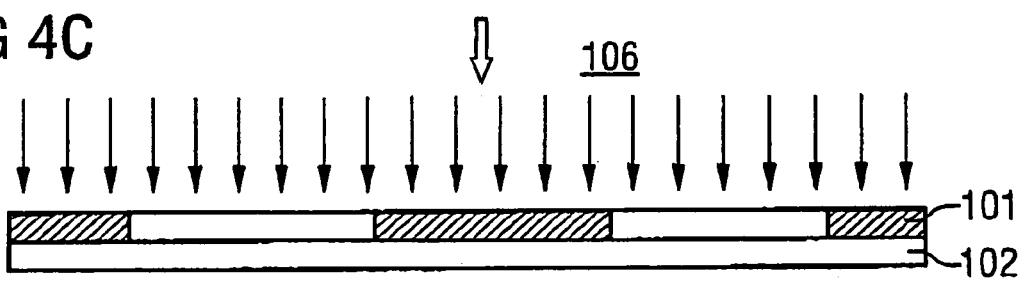
Figure 4D:
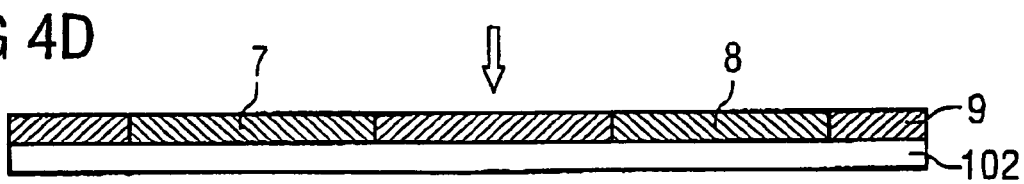
Figure 4E:
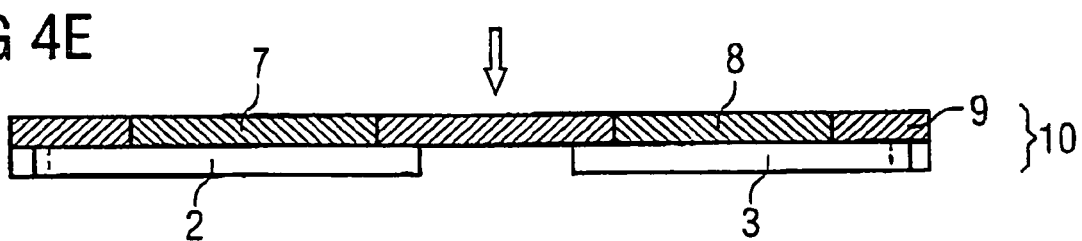

As an alternative, for the patterning of the plastic layer, firstly a photomask 104 is arranged above or on said plastic layer, which photomask shades the regions 70, 80 of the contact-making windows 7,8 (FIG. 4b). The plastic layer is then incipiently cured or cured, such as by means of UV radiation 105, in the regions which are intended to remain on the connection conductor layer 102 (FIG. 4b). The photomask layer 104 is subsequently removed and the plastic layer is then etched from the connection conductor layer 102 by means of a suitable solvent 106 in the regions 70, 80 of the contact-making windows 7, 8 (FIG. 4c).

In a method for producing a leadframe strip 200 having a multiplicity of component regions, at least one contact-making window 7 and at least two connection conductors 2, 3 are formed in each component region by means of one of the methods described above.

Figure 5A:
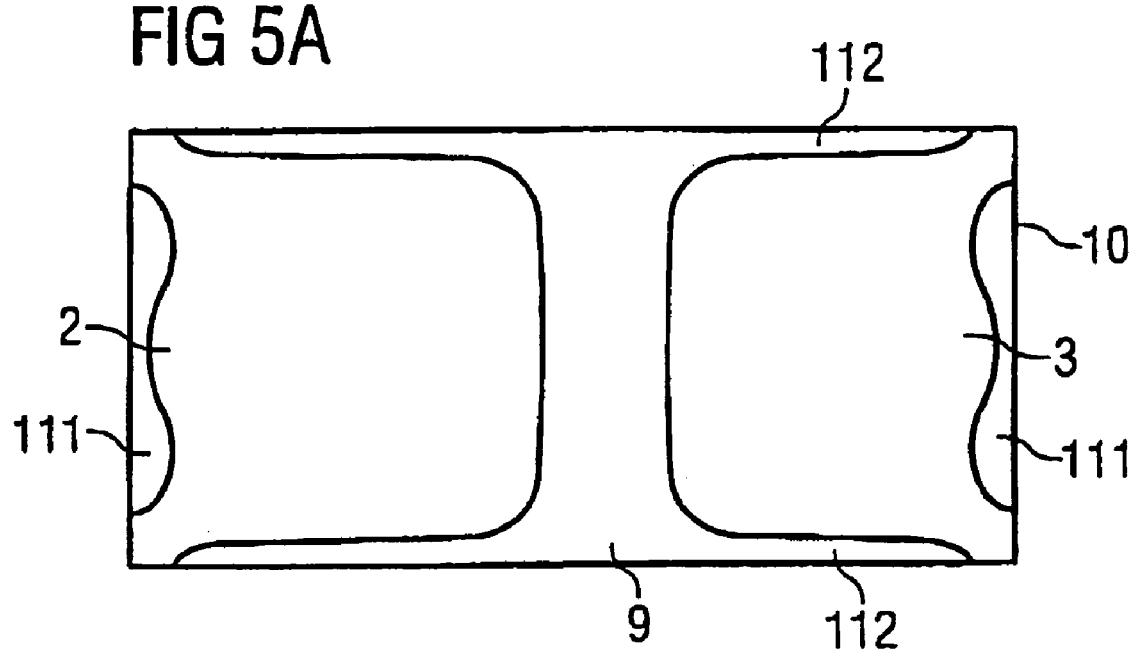
FIGS. 5a and 5b show a diagrammatic plan view from below and a diagrammatic plan view from above, respectively, of a leadframe according to the invention.
Figure 5B:
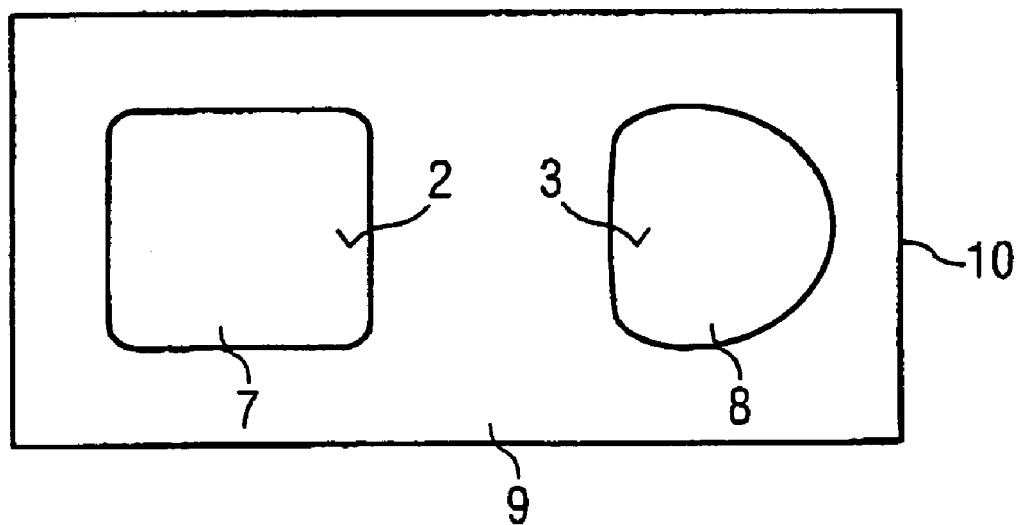

Along separating lines 110 between in each case two adjacent component regions, the connection conductor layer preferably has recesses 111 and 112 in which the connection conductor layer is removed (FIGS. 5a and 6b).

In an exemplary method for producing a surface mountable light-emitting component in accordance with FIG. 1 having at least one light-emitting diode or laser diode chip 1, at least two connection conductors 2, 3, which are connected to at least two electrical contacts 4, 5 of the semiconductor chip 1, and having a chip housing 11, which has a connection carrier 9 and a chip encapsulation 6, specifically: a) the carrier layer 101 is applied to the connection conductor layer 102 and then at least one chip window 7 and at least one wire connection window 8 are patterned in the carrier layer 101 and the external electrical connection conductors 2, 3 are patterned in the connection conduction layer 102 (cf. FIGS. 3a-3f, 4a-4e and 6a-6b); b) the semiconductor chip 1 is mounted into the chip window 7; c) at least one electrical contact 5 of the semiconductor chip 1 is electrically connected to a connection conductor 3 through the wire connection window 8 by means of a bonding wire 50; d) the composite comprising patterned connection conductor layer 102, patterned carrier layer 101, semiconductor chip 1 and bonding wire 50 is placed into an injection mold; and e) the semiconductor chip 1 including bonding wire 50 is encapsulated with encapsulating material 6 by injection molding, which material is subsequently at least partly cured.

Figure 7:
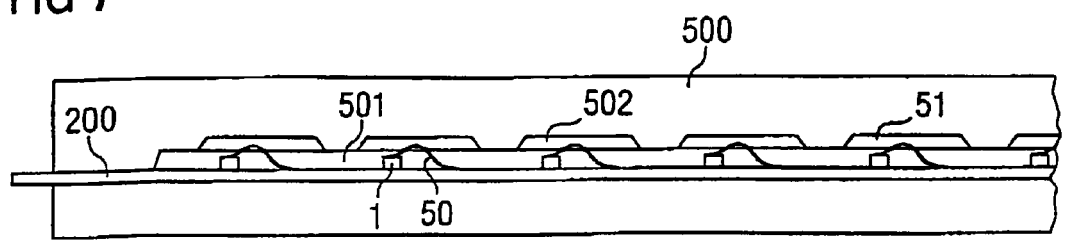
FIG. 7 shows a partial diagrammatic illustration of a sectional view of an injection mold with a leadframe strip inserted.

For the mass production of such components, arrays 201 with in each case a multiplicity of component regions 202 with in each case at least one chip window 7, at least one wire connection window 8 and at least two connection conductors 2, 3 are produced in a laminate strip comprising connection conductor layer 102 and carrier layer 101 (cf. FIGS. 6a and 6b). After the mounting of semiconductor chips 1 into the chip windows 7 and electrical connection of the semiconductor chips 1 to the connection conductors 2, 3, each array is placed into an injection mold 500 (FIG. 7), in which a single cavity 501 which spans all the component regions 202 of the array 201 and forms a void there essentially exclusively on the side of the semiconductor chips 1 is provided for in each case an entire array 201. After the injection of encapsulation material 60 into the cavity 501 and the at least partial curing thereof, the array 201 is removed from the injection mold 500 and singulated into mutually separate semiconductor components by severing the encapsulation material 60 and the connection carrier layer 101.

An exemplary method for producing a surface-mountable light-emitting component in accordance with FIG. 2 having at least one light-emitting diode or laser diode chip 1, at least two connection conductors 2, 3, which are connected to at least two electrical contacts 4, 5 of the semiconductor chip 1, and having a chip housing 11, which has a connection carrier 9 and a chip encapsulation 6, differs from the method just described merely by the fact that each component region has only one chip window and no wire connection window, and that the chip 1 is mounted onto the connection conductors 2 and 3 in the chip window 7 in rotated fashion with its light-generating epitaxial layer facing toward said connection conductors. Both electrical contacts 4 and 5 are situated on the same side of the chip 1. The contact 4 lies on the connection conductor 2 and the contact 5 lies on the connection conductor 3.

As mentioned above, the carrier layer can be incipiently cured or cured preferably by means of UV radiation. As an alternative, it may be able to be incipiently cured or cured by means of thermal radiation. The carrier layer can comprise polyimide monomer.

The method according to the invention is suitable for producing electromagnetic radiation-emitting and/or -receiving components having one or more electromagnetic radiation-emitting and/or -receiving semiconductor chips. It is suitable in particular for producing light-emitting diode components having a housing installation barrier with the dimensioning 0402 (corresponding to 0.5 mm×1.0 mm) or less and a device height of less than 400 μm, in particular less than 350 μm.

In the case of optoelectronic components, use is made of a chip encapsulation composed of a material which transmits electromagnetic radiation, in particular is transparent or translucent in the case of light-emitters. An example of an encapsulation compound in this respect is unfilled clear plastic material. Such materials are known and, therefore, are not explained in any further detail at this point.

In order to produce a light-emitting diode component which radiates mixed colored light, the chip encapsulation may have added to it a luminescent material which absorbs at least part of the electromagnetic radiation emitted by the light-emitting diode chip and emits electromagnetic radiation of a different wavelength and color than the absorbed radiation.

The injection of encapsulation material into the cavity as outlined above can be effected from the side and in particular via a film gate. After the encapsulation material has been at least partly incipiently cured or cured, the array is removed from the injection mold and singulated into individual semiconductor components by severing the chip encapsulation material and the leadframe between the component regions.

In a central region above the semiconductor chip and, if appropriate, one or more bonding wires to the semiconductor chip, perpendicular to the leadframe, the chip encapsulation can be given a greater thickness than in an edge region extending around the central region. For this purpose, the cavity 501 has a multiplicity of recesses 502 each spanning one or more semiconductor chips 1. In this way, the volume of encapsulation material is reduced by reduction of the thickness of the encapsulation material in regions where this is permissible with respect to the thickness in the region of semiconductor chips 1 and, if appropriate, one or more bonding wires 50 to the semiconductor chip 1. This makes it possible to counteract a bulging of the component array during the production method on account of different thermal expansions of leadframe laminate and chip encapsulation.

Figure 8:
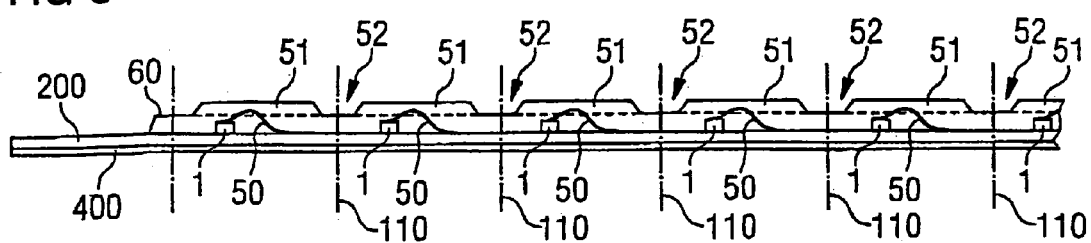
FIG. 8 shows a partial diagrammatic illustration of a sectional view of a leadframe strip with encapsulated semiconductor chips.

A separate recess 502 can be provided above each semiconductor chip of the array in such a way that, after the injection-molding process, the encapsulation material has a multiplicity of elevations 51 arranged next to one another. The resulting encapsulation can have a structure similar to a chocolate bar (cf. FIG. 8).

The array can be singulated by severing the encapsulation material and the leadframe in the trenches 52 between the elevations 51.

An adhesion promoter can be expediently applied to the carrier layer 101 before the array is placed into the injection mold 500, which adhesion promoter improves the adhesion of the encapsulation material on the leadframe. A Polyimide covering resist is preferably used for this purpose.

With regard to technically simple handling of the semiconductor components after singulation, the leadframe can be laminated onto an auxiliary film 400 by its rear side before being placed into the injection mold. This auxiliary film protects the connection conductors 2, 3 on the one hand from mechanical damage (e.g., scratching) and on the other hand from undesirable covering of the connection conductors with encapsulation material, that is to say from a so-called flash on the rear side of the leadframe strip.

The auxiliary film expediently has a thermal expansion coefficient similar to or greater than that of the encapsulation material in such a way that it counteracts to the greatest possible extent a bulging of the array on account of greater shrinkage of the encapsulation material in relation to the leadframe during the curing and/or cooling of said material after the encapsulation of the array by injection molding.

For basically the same purpose, the laminate strip may have, outside the arrays, holes, perforations and/or slots for reducing mechanical strains on account of different thermal expansions and/or material shrinkages.

As a further alternative or additional measure, it is possible to use a bowed injection mold in which the array is convexly curved during the injection of the encapsulation compound into the cavity as seen from the side on which the material having the greater thermal expansion coefficient is later situated.

In order to enable electrical and/or optical testing of the semiconductor components, the array is applied to a film by the encapsulation side prior to singulation and then, if appropriate, the auxiliary film is stripped away from the rear side of the leadframe. For the case where optical measurement of the semiconductor component is necessary, said film preferably transmits electromagnetic radiation and the measurement is effected through the film.

In all the methods outlined above, the singulation of the array can be effected by means of sawing, laser separation and/or water jet cutting.

The scope of protection of the invention is not limited to the examples given hereinabove. The invention is embodied in each novel characteristic and each combination of characteristics, which includes every combination of any features which are stated in the claims, even if this combination of features is not explicitly stated in the claims.

A number of embodiments of the invention have been described. Nevertheless, it will be understood that various modifications may be made without departing from the spirit and scope of the invention. Accordingly, other embodiments are within the scope of the following claims.

What is claimed is:

1. A component comprising:
  a composite, wherein the composite is a laminate that consists of an electrically insulating carrier layer and a conductive connection conductor layer, the conductive connection conductor layer forming at least two electrically conductive connection conductors, the electrically insulating carrier layer having a first contact-making window and a second contact-making window, wherein the windows extend all the way through a thickness of the carrier layer;
  a semiconductor chip having a first electrical contact and a second electrical contact, wherein the semiconductor chip is mounted onto at least one conductor of the conductors in the first contact-making window and the first electrical contact of the semiconductor chip is electrically conductively connected through the first contact-making window to the connection conductor and the second electrical contact is electrically conductively connected through the second contact-making window to at least one of the connection conductors, and wherein the semiconductor chip is capable of emitting and/or receiving electromagnetic radiation; and
  a chip encapsulation through which the electromagnetic radiation is transmittable on the semiconductor chip, wherein a lateral direction is perpendicular to the thickness of the carrier layer and neither the electrically insulating carrier layer nor the conductive connection conductor layer protrude the chip encapsulation in the lateral direction;
  wherein the component is a surface-mountable component and the at least two connection conductors are formed as external electrical connection conductors for external electrical contact connection to the semiconductor chip.

2. The component of claim 1, wherein the thickness of the carrier layer is less than 80 µm.

3. The component of claim 2, wherein the thickness of the carrier layer is between from and including 30 µm and up to and including 60 µm.

4. The component of claim 1, wherein a thickness of the connection conductors is less than 80 µm.

5. The component of claim 4, wherein the thickness of the connection conductors is between from and including 30 µm and up to and including 60 µm.

6. The component of claim 1, wherein the semiconductor chip is mounted on a first side of the connection conductor with the connection conductor being exposed on a side opposite to the first side for electrical connection to an electrical component.

7. The component of claim 1, wherein the second electrical contact of the semiconductor chip is electrically connected to at least one of the connection conductors by a bonding wire through the second contact-making window in the carrier layer.

8. The component of claim 7, wherein the first electrical contact is arranged on a side of the semiconductor chip opposite of the second electrical contact.

9. The component of claim 1, wherein the first contact-making window is a chip window in which the semiconductor chip is mounted on the first connection conductor and the second contact-making window is a wire connection window through which the second contact of the semiconductor chip is connected to the second connection conductor.

10. The component of claim 1, wherein the semiconductor chip is connected to one surface of the connection conductor layer and an opposing surface of the connection conductor layer is exposed.

11. The component of claim 10, wherein a portion of the electrical connection that is exposed is directly adjacent to the semiconductor chip.

12. The component of claim 1, wherein a surface of the chip encapsulation at least in places is flush with the composite.

13. A component comprising:
- a composite, wherein the composite is a laminate that consists of an electrically insulating carrier layer and a conductive connection conductor layer, the conductive connection conductor layer forming at least two electrically conductive connection conductors, the electrically insulating carrier layer having at least one chip window wherein the window extends all the way through a thickness of the carrier layer;
- a semiconductor chip having two electrical contacts situated on a same side of the semiconductor chip and the two electrical contacts mounted on the connection conductors such that each of the electrical contacts of the semiconductor chip is conductively connected to a connection conductor of the connection conductors through a single chip window, wherein the semiconductor chip is capable of emitting and/or receiving electromagnetic radiation; and
- a chip encapsulation through which the electromagnetic radiation is transmittable on the semiconductor chip, wherein a lateral direction is perpendicular to the thickness of the carrier layer and neither the electrically insulating carrier layer nor the conductive connection conductor layer protrude the chip encapsulation in the lateral direction;
- wherein the component is a surface-mountable component and the at least two connection conductors are formed as external electrical connection conductors for external electrical contact connection to the semiconductor chip.

14. The component of claim 13, wherein two of the connection conductors overlap the chip window and the semiconductor chip is arranged on these connection conductors such that the two electrical contacts of the chip bear on these connection conductors and are electrically connected thereto.

15. The component of claim 13, wherein the semiconductor chip has a light generating epitaxial layer and is mounted on the connection conductors such that the epitaxial layer faces the connection conductors.

16. The component of claim 13, wherein the thickness of the carrier layer is less than 80 μm.

17. The component of claim 16, wherein the thickness of the carrier layer is between from and including 30 μm and up to and including 60 μm.

18. The component of claim 13, wherein a thickness of the connection conductors is less than 80 μm.

19. The component of claim 18, wherein the thickness of the connection conductors is between from and including 30 μm and up to and including 60 μm.

20. The component of claim 13, wherein the semiconductor chip is mounted on a first side of the connection conductor with the connection conductor being exposed on a side opposite to the first side for electrical connection to an electrical component.

21. The component of claim 20, wherein a portion of the electrical connection that is exposed is directly adjacent to the semiconductor chip.

22. The component of claim 13, wherein a surface of the chip encapsulation at least in places is flush with the composite.

23. A component comprising:
- a composite comprising at least two electrically conductive connection conductors and an electrically insulating carrier layer, the carrier layer having a first contact-making window and a second contact-making window;
- a semiconductor chip having a first electrical contact and a second electrical contact, wherein the semiconductor chip is mounted onto at least one conductor of the conductors in the first contact-making window and the first electrical contact of the semiconductor chip is electrically conductively connected through the first contact-making window to the connection conductor and the second electrical contact is electrically conductively connected through the second contact-making window to at least one of the connection conductors, and wherein the semiconductor chip is capable of emitting and/or receiving electromagnetic radiation; and
- a chip encapsulation through which the electromagnetic radiation is transmittable on the semiconductor chip;
- wherein the component is a surface-mountable component and the at least two connection conductors are formed as external electrical connection conductors for external electrical contact connection to the semiconductor chip; and
- wherein the windows extend all the way through a thickness of the carrier layer, a lateral direction is perpendicular to the thickness of the carrier layer, and neither the electrically insulating carrier layer nor the conductive connection conductor layer extend beyond a side surface of the chip encapsulation in the lateral direction.

* * * * *